United States Patent
Murray et al.

(10) Patent No.: US 9,748,169 B1
(45) Date of Patent: Aug. 29, 2017

(54) TREATING COPPER INTERCONNECTS

(71) Applicant: International Business Machines Corporation, Armonk, NY (US)

(72) Inventors: Conal E. Murray, Yorktown Heights, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/090,017

(22) Filed: Apr. 4, 2016

(51) Int. Cl.
*H01L 21/768* (2006.01)
*H01L 23/522* (2006.01)
*H01L 23/528* (2006.01)
*H01L 23/532* (2006.01)

(52) U.S. Cl.
CPC .... *H01L 23/5226* (2013.01); *H01L 21/76802* (2013.01); *H01L 21/76877* (2013.01); *H01L 21/76888* (2013.01); *H01L 21/76889* (2013.01); *H01L 23/528* (2013.01); *H01L 23/53209* (2013.01)

(58) Field of Classification Search
CPC ......... H01L 21/76802; H01L 21/76877; H01L 21/76888; H01L 21/76889
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,287,977 B1 | 9/2001 | Hashim et al. | |
| 6,323,554 B1 | 11/2001 | Joshi et al. | |
| 6,342,733 B1 | 1/2002 | Hu et al. | |
| 6,706,625 B1 | 3/2004 | Sudijono et al. | |
| 6,844,258 B1 | 1/2005 | Fair et al. | |
| 7,598,614 B2 * | 10/2009 | Gambino | H01L 21/288 257/751 |
| 7,648,899 B1 | 1/2010 | Banerji et al. | |
| 8,013,446 B2 | 9/2011 | Yang et al. | |
| 8,962,479 B2 | 2/2015 | Yang et al. | |
| 2009/0053538 A1* | 2/2009 | Ma | H01L 21/76805 428/457 |
| 2014/0332964 A1* | 11/2014 | Yang | H01L 21/768 257/762 |

OTHER PUBLICATIONS

Conal E. Murray et al., "Treating Copper Interconnects", U.S. Appl. No. 15/349,168, filed Apr. 4, 2016.
List of IBM Patents or Patent Applications Treated as Related; (Appendix P), Filed Apr. 13, 2017; 2 pages.

* cited by examiner

*Primary Examiner* — Peniel M Gumedzoe
(74) *Attorney, Agent, or Firm* — Cantor Colburn LLP; Vazken Alexanian (57) ABSTRACT

Techniques relate to treating metallic interconnects of semiconductors. A metallic interconnect is formed in a layer. A metallic cap is disposed on top of the metallic interconnect. Any metallic residue, formed during the disposing of the metallic cap, is converted into insulating material.

11 Claims, 9 Drawing Sheets

FIG. 8
PARTIALLY FORMED INTO INSULATING MATERIAL

FIG. 9
COMPLETELY OR NEARLY COMPLETELY FORMED INTO INSULATING MATERIAL

TREATING COPPER INTERCONNECTS

BACKGROUND

The present invention relates generally to semiconductors, and more specifically, to treating copper interconnects of semiconductors.

Semiconductor-based integrated circuits consist of several layers, such as back-end-of-line (BEOL) levels which provide power to the underlying devices that reside in the front-end-of-line. Copper or other conductive materials comprise the interconnect metallization in the BEOL levels. Because copper is a better conductor than aluminum, chips using copper interconnects can have smaller metal components, dissipate less energy to pass electric current through them and can exhibit higher speed signal transmission. Accordingly, copper interconnects are ideal for use in higher-performance processors.

Electromigration has become a concern as integrated circuit component sizes become smaller. Electromigration is a process by which atoms within a conductive material diffuse under the influence of an electric current flowing through it. Eventually, electromigration can cause voids to form in the material and can lead to open circuit failure within the conductor. Resistance to electromigration can be better in copper than in aluminum. Superior electromigration resistance allows higher currents to flow through a given volume of a copper conductor compared to the same volume of an aluminum conductor. Accordingly, copper-based interconnects are used throughout the semiconductor industry.

SUMMARY

According to one or more embodiments, a method of treating metallic interconnects is provided. The method includes forming a metallic interconnect in a layer, disposing a metallic cap on top of the metallic interconnect, and converting a metallic residue, formed during the disposing of the metallic cap, into insulating material.

According to one or more embodiments, a semiconductor device having treated metallic interconnects is provided. The semiconductor device includes a metallic interconnect formed in a layer, and a metallic cap disposed on top of the metallic interconnect. Also, the semiconductor device includes insulating material formed at one or more locations on the layer, and the insulating material includes metallic residue that has been treated.

According to one or more embodiments, a method of treating metallic interconnects is provided. The method includes forming the metallic interconnects in a layer, where each of the metallic interconnects is separate from one another. The method includes disposing a metallic cap on top of each of the metallic interconnects, and converting any metallic residue, formed during the disposing of the metallic cap, into insulating material. The insulating material prevents any metallic residue from being conductive, thereby avoiding electrical connection between the metallic interconnects.

DETAILED DESCRIPTION

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

As the dimensions of interconnect metallization used in integrated circuits continue to decrease, the current densities required to power the devices in current and future generations of semiconductor devices may lead to electromigration-induced failure. It has been demonstrated that a metal capping layer on top of Cu interconnects improves the electromigration resistance of the metal capped Cu interconnects over those with a conventional dielectric capping material. Metallic caps selectively deposited on interconnect trenches have been demonstrated to decrease failures due to electromigration. However, the metal cap deposition process often leaves metallic residue on the top surface of the dielectric insulation between the trenches. This metallic residue can lead to high leakage currents between adjacent trenches and can cause time-dependent dielectric breakdown (TDDB). Accordingly, selectivity of the metal cap deposition is always a concern. In most cases, metal particles and/or residue can remain on the dielectric surface and can lead to line-to-line leakage issues.

Embodiments mitigate the effects of the metallic residue between the interconnect trenches. One or more embodiments perform a post deposition treatment to convert the metallic particles/residue into insulating material, and/or to maintain reliability of the Cu interconnects (without leakage-related yield degradation from the metal cap).

One or more embodiments involve treating the top surface of the dielectric insulation by reacting the metallic residue in a nitrogen-based ambient, oxygen-based ambient, and/or silane-based ambient. The resulting metallic residue is nitridized, oxidized, or silicidized/silylate, thereby rendering the residue electrically inert by converting it into an insulating material and leaving the underlying dielectric insulation layer undamaged. The resulting leakage current between interconnect trenches possessing metallic caps is much less (e.g., nonexistent or nearly nonexistent) than interconnect trenches without the treatment. Furthermore, the resulting leakage current between interconnect trenches possessing metallic caps is comparable to interconnect trenches without metallic caps. The yield of the interconnect trenches with metallic capping that undergo the disclosed treatment is also improved over the corresponding metal capped interconnect trenches without treatment, which suggests that failures due to shorting or TDDB effects are also mitigated.

Figure 1:
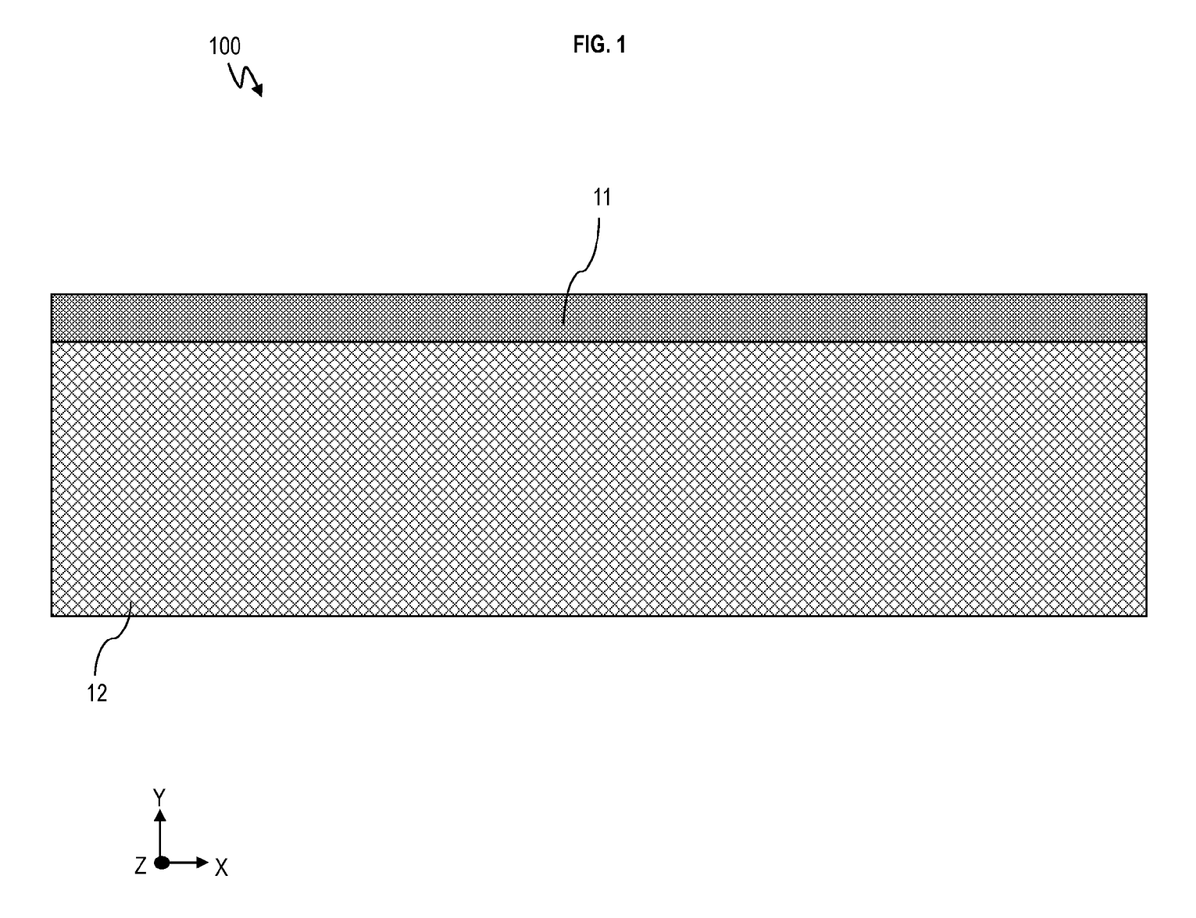
FIG. 1 is a cross-sectional view of a semiconductor device according to one or more embodiments.

Now turning to the figures, FIG. 1 is a cross-sectional view of a semiconductor device 100 according to one or more embodiments. A sacrificial layer 11 is disposed on top of a bottom layer 12.

The sacrificial layer 11 may be a sacrificial dielectric layer. An example of the sacrificial layer 11 may include $SiO_2$, silicon nitride, silicon carbide, or any combination thereof.

The bottom layer 12 may be an inter-level dielectric or interlayer dielectric (ILD). The material of the bottom layer 12 may be $SiO_2$, silsesquioxanes, carbon-doped oxides (i.e., organosilicates) that include atoms of Si, C, O and H, thermosetting polyarylene ethers, and/or multilayers thereof, along with ultra-low k dielectric materials. In one example, ultra-low k dielectric materials may be dielectric materials having a dielectric constant k value of less than (<) 2.5. In another example, the ultra-low dielectric material may be dielectric materials having a dielectric constant k value as close to 1 as possible.

Figure 2:
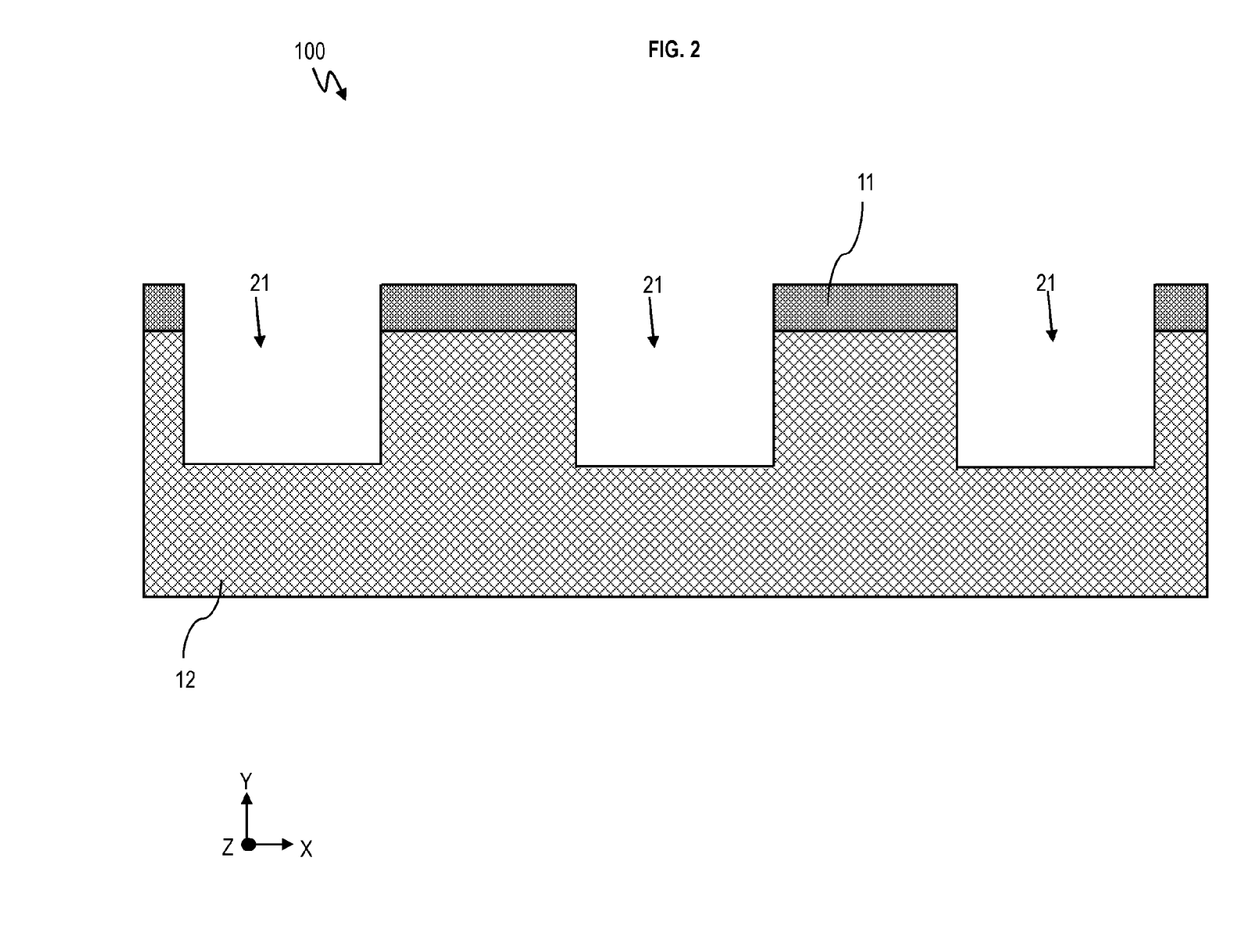
FIG. 2 is a cross-sectional view of the semiconductor device depicting trench formation according to one or more embodiments.

FIG. 2 is a cross-sectional view of the semiconductor device 100 depicting trench formation according to one or more embodiments. Trenches 21 are formed in the bottom layer 12 and sacrificial layer 11. Patterning and formation of the trenches 21 may be through standard lithography and etching processes. The trenches 21 extend in the z-axis. The trenches 21 are the regions where the interconnect lines are to be formed.

Figure 3:
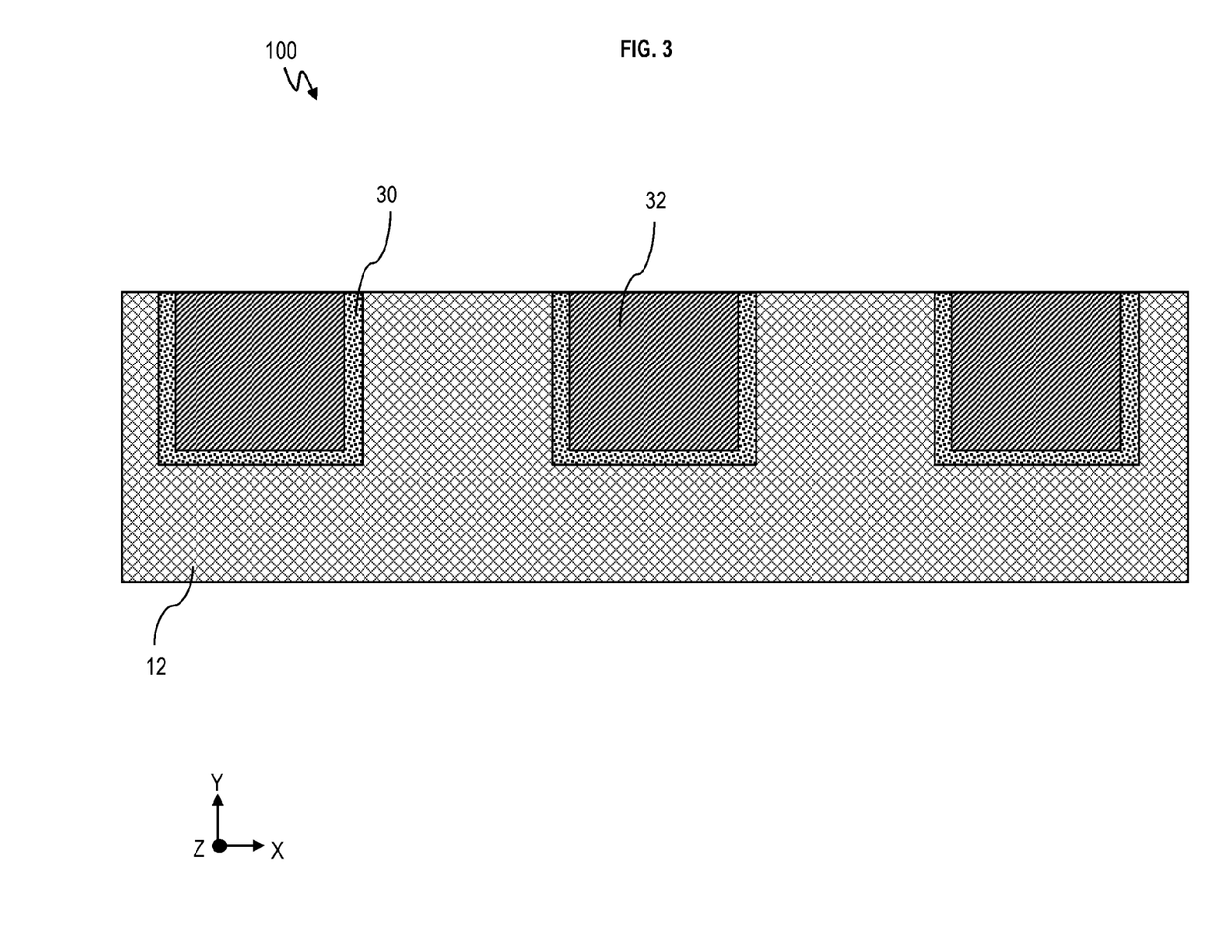
FIG. 3 is a cross-sectional view of the semiconductor device depicting metallization according to one or more embodiments.

FIG. 3 is a cross-sectional view of the semiconductor device 100 depicting metallization and chemical mechanical polishing (CMP) according to one or more embodiments. FIG. 3 illustrates that the trenches 21 are filled with metal to form the metal interconnects 32. Within the trench 21, the metal interconnects 32 are surrounded by a liner layer 30, such that liner layer 30 separates the metal interconnects 32 from being in contact with the sides or bottom of the trench 21 of the bottom layer 12. The metal interconnects 32 are metal lines that extend in and out of the page in the z-axis.

Examples of the metal interconnects 32 may include high conductivity materials such as Cu, W, Al, Co, Ru, and/or any combination thereof. Metal interconnects 32 are also referred to as copper interconnects. The metal interconnects 32 are sometimes referred to as lines, metal lines, etc.

As noted above, the trenches 21 may be lined with the liner layer 30, and the liner layer 30 may include or represent more than one layer. A first layer of the liner layer 30 may be a barrier layer formed directly in the trench 21 of the bottom layer 12. The barrier layer forms a lining on the entire surface of the trench 21. The barrier metal layer is to completely surround all copper interconnections, because diffusion of copper into surrounding materials would degrade their properties. The barrier metal layer is to limit copper diffusivity sufficiently to chemically isolate the copper conductor from the bottom layer, yet to have high electrical conductivity in order to maintain a good electronic contact.

The second layer of the liner layer 30 may be a seed layer formed on top of the barrier layer. The seed layer is in preparation to form the metal interconnect 32. The seed layer may be a copper seed. The barrier layer may be composed of Ta, Ti, Co, W, Ru, their nitrides, and/or any combination thereof.

Metallization is a process used to deposit a metal, such as depositing the metal interconnects 32 in the trenches 21. Metallization may be performed by physical vapor deposition (PVD), sputtering, chemical vapor deposition (CVD), atomic layer deposition (ALD), electroless deposition, etc.

The sacrificial layer 11 may be etched away, and the semiconductor device 100 may be planarized by chemical mechanical polishing (CMP) to form a level surface.

The metal interconnect 32 is connected to other features as understood by one skilled in the art. The bottom layer 12 may be disposed on one or more other layers. The other layers may include contacts, metal vias, other metal lines, logic devices including transistors, etc., which connect to the metal interconnects 32, as understood by one skilled in the art. Any other layers that may be formed below the bottom layer 12 are not shown, so as not to obscure the figures.

Figure 4:
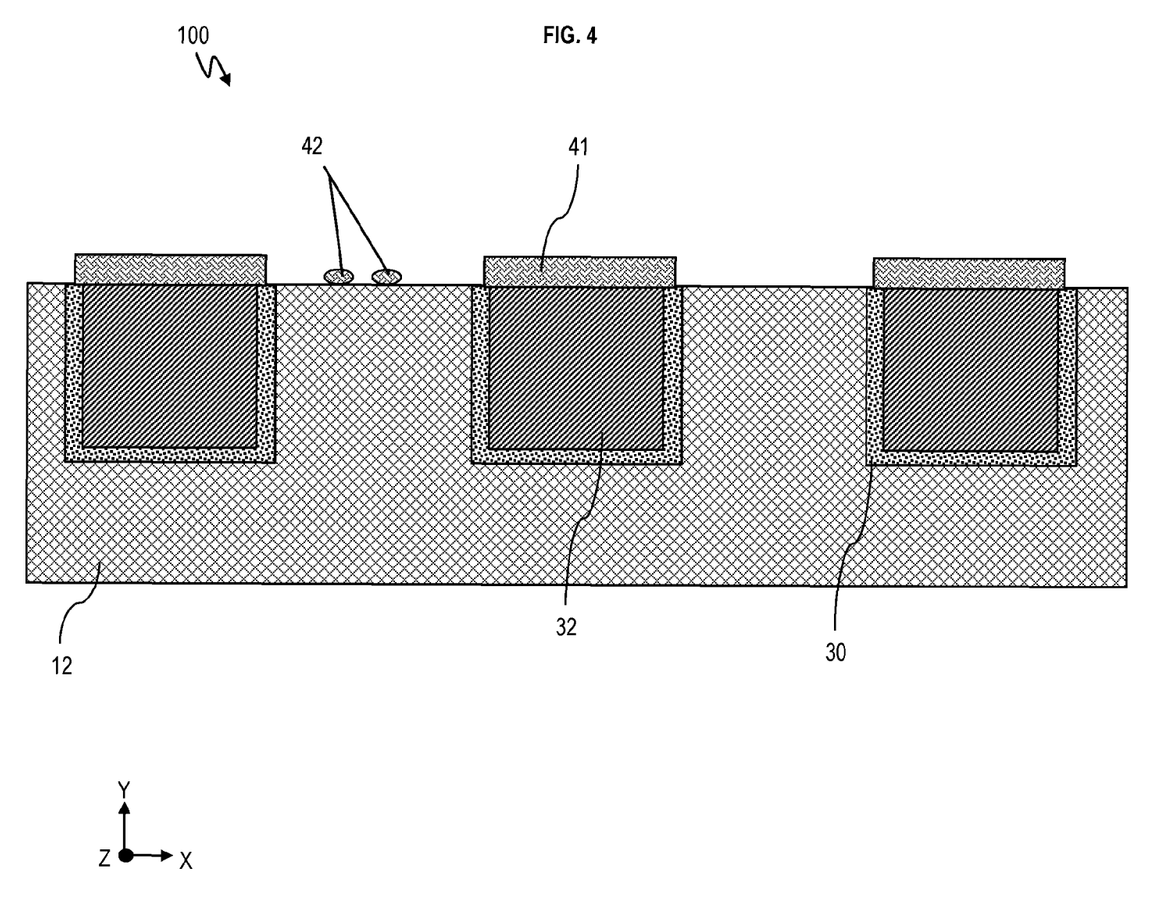
FIG. 4 is a cross-sectional view of the semiconductor device depicting metal cap deposition according to one or more embodiments.

FIG. 4 is a cross-sectional view of the semiconductor device 100 depicting metal cap deposition according to one or more embodiments. A metal cap 41 is formed on top of the metal interconnect 32. The metal cap 41 prevents electromigration in the metal interconnect 32. The metal cap 41 may be deposited by chemical vapor deposition (CVD), atomic layer deposition (ALD), electroless deposition, etc. Examples materials of the metal cap 41 may include Co, Ru, Mn, and/or Co having small fractions of at least one of W, P, and/or B. The metal cap 41 may have a thickness ranging from 2 to 20 nm, with a preferred (but not a necessity) thickness in the range of 5 to 10 nm.

During the metal cap deposition process, metal residue (metallic residue) 42 may be formed on the top surface of the bottom layer 12 in various locations. The metallic residue 42 can cause leakage-related issues. In one case, the metallic residue 42 may cause the electrical current flowing in one metal interconnect 32 to arc to its neighboring metal interconnect 32, which is a line-to-line issue.

Figure 5:
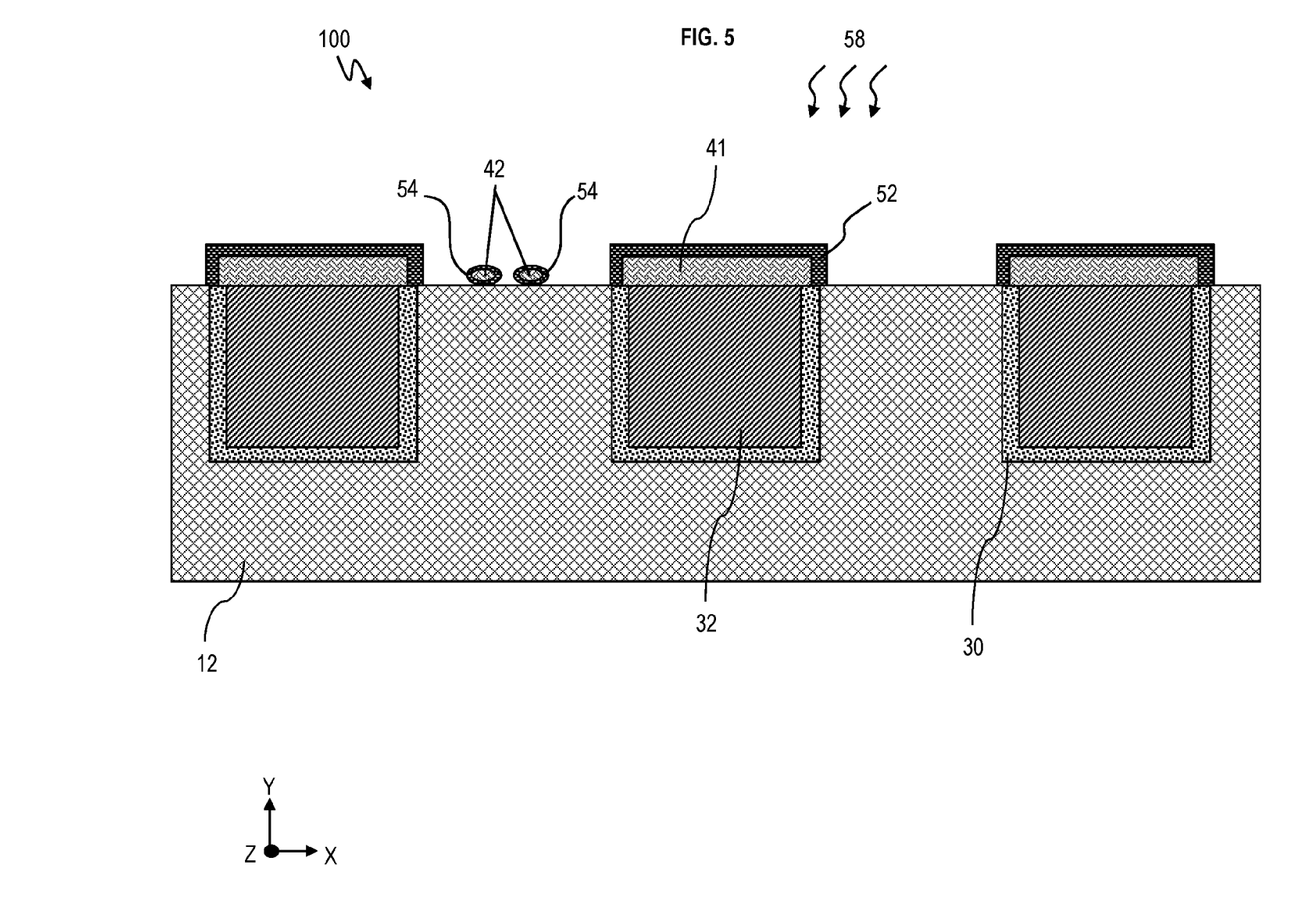
FIG. 5 is a cross-sectional view of the semiconductor device depicting a post deposition treatment process to convert metallic residue into insulating material according to one or more embodiments.

FIG. 5 is a cross-sectional view of the semiconductor device 100 depicting a post deposition treatment process according to one or more embodiments. As another illustration, FIG. 6 is a cross-sectional view of the semiconductor device 100 depicting the post deposition treatment process according to one or more embodiments.

The post deposition treatment process is a cleaning process to change the metallic residue 42 into insulating/insulation material, such that insulation material does not cause leakage-related issues.

A reactant 58 is used to treat/clean the metallic residue 42. The reactant 58 converts the metallic residue 42 into insulating material 54. FIG. 5 is an example illustrating that the metallic residue 42 is partially converted into the insulating material 54. In this case, at least the outer surface of the metallic residue 42 is converted into the insulating material 54, thus preventing a conduction path for current to flow between adjacent metal lines 32. Inside the covered/outer surface formed of insulating material 54, one or more parts of the metallic residue 42 may not be converted and may still be metallic on the inside. However, the outside of the metallic residue 42 has been converted and its conductivity is greatly reduced.

Figure 6:
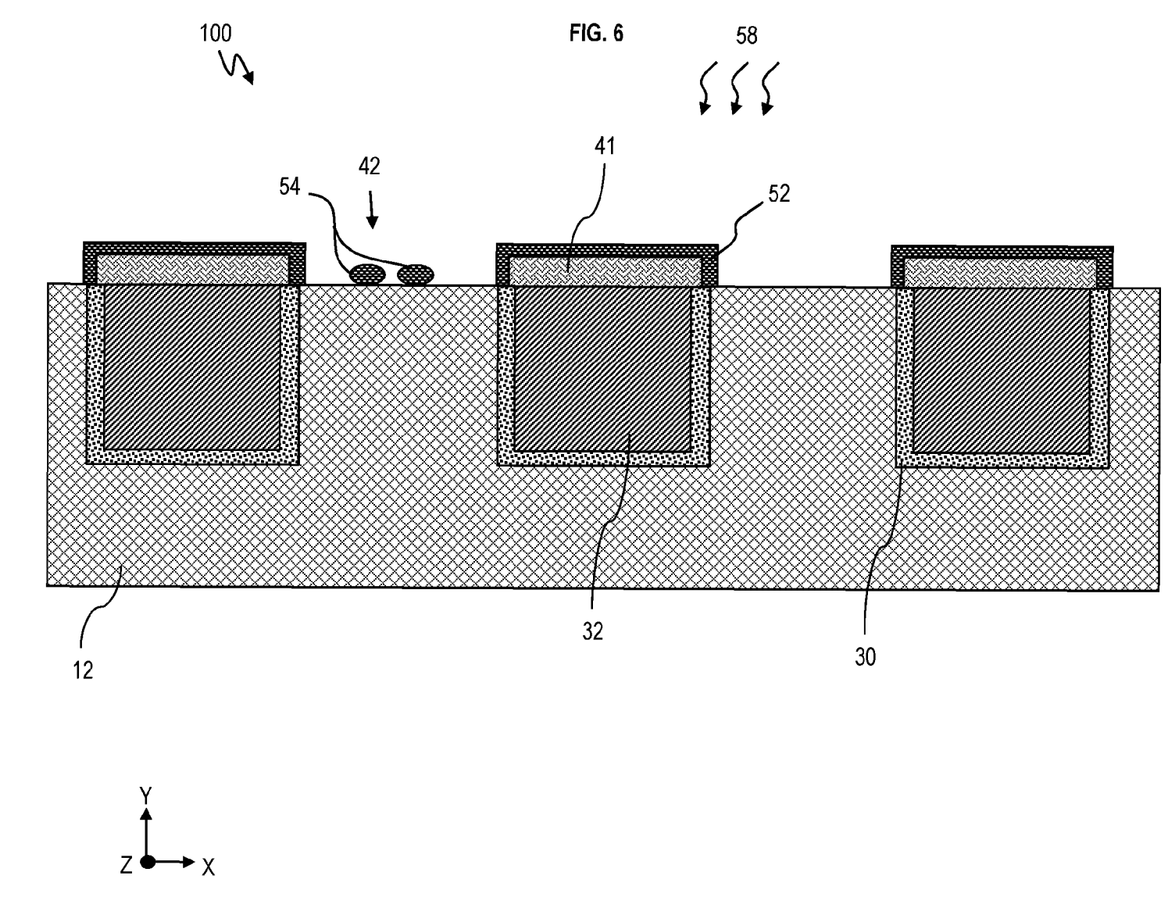
FIG. 6 is a cross-sectional view of the semiconductor device depicting the post deposition treatment process to convert metallic residue into insulating material according to one or more embodiments.

As another example, FIG. 6 illustrates that the metallic residue 42 is completely converted or nearly completely converted into the insulating material 54. In this case, both the outer surface and inside of the metallic residue 42 have been converted to insulating material, thus preventing current leakage.

In one implementation, some of the metallic residue 42 may be partially converted into the insulating material 54 as depicted in FIG. 5, while some of the metallic residue 42 may be completely converted into the insulating material 54 as depicted in FIG. 6. Although metallic residue 42 is illustrated as having a uniform size or shape for explanation purposes, it is appreciated that the metallic residue 42 may have all shapes and sizes.

During the post deposition treatment process, surfaces of the metal cap 41 may be converted into the insulating material 52. For example, a thin layer of the insulating material 52 may be around the metal cap 41.

The reactant 58 may be a gas in the ambient that reacts to metal used to form the metal cap 41. Examples of the reactant gas 58 may be $SiH_4$ (to form silicide), $O_3$ (to form oxide), $O_2$ (to form oxide), $N_2$ (to form nitride), $NH_3$ (to form nitride), and/or other chemicals containing Si, O, and N (to form silicate, silicide, oxide, and nitride). In one implementation, the post deposition treatment process may be plasma treatment and/or annealing to cause the reaction of the reactant 58 and the metal residue 42. According to the particular reactant gas 58, the post deposition treatment process may silylate, oxidize, and/or nitridize the metallic residue 42 thereby resulting in the insulating material 54. Similarly, the post deposition treatment process may silylate, oxidize, and/or nitridize surfaces of the metal cap 41. Accordingly, the metallic residue 42 and the metal cap 41 become silicate, silicide, oxide, and/or nitride because of the reactant gas 58.

For example, oxidation coverts the metallic residue 42 and the metal cap 41 into oxide by including oxygen as the reactant 58. Nitridation coverts the metallic residue 42 and the metal cap 41 into nitride by including nitrogen as the reactant 58. Silylation coverts the metallic residue 42 and the metal cap 41 into silicide by including silane in the reactant 58. In the case when the metal used to form the metal cap 41 and metallic residue 42 is cobalt, converting to silicide as the insulating material 52 and insulating material 54 is not a feasible option as the silicide may have conductive properties in this situation. Instead, a combination of silane and oxygen may be used to form an insulating silicate.

It should be appreciated that converting the metallic residue 42 to the insulating material 54 and the metal cap 41 to the insulating material 52 is not limited to the examples provided. According to the teachings disclosed herein, it is contemplated that the insulating material 52 and 54 may be other types of material and that other reactants 58 may be utilized to accomplish the post deposition treatment process.

The insulating material 52 and 54 are the same insulating material because the metal cap 41 and metallic residue 42 are formed of the same conductive material, which has been converted via the reactant 58.

Figure 7:
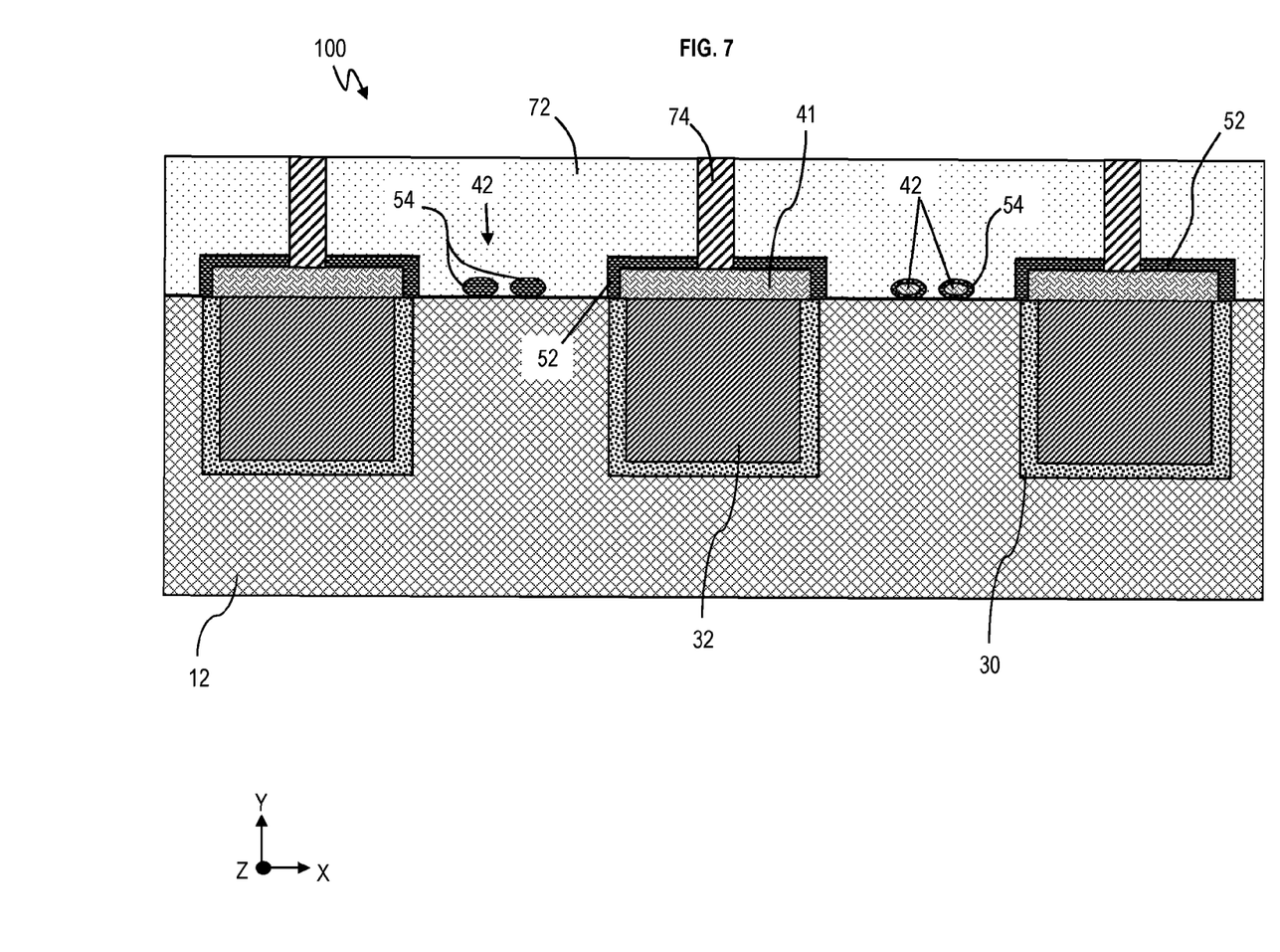
FIG. 7 is a cross-sectional view of the semiconductor device depicting additional interconnect level manufactured above the level which received the post deposition treatment process to convert metallic residue into insulating material according to one or more embodiments.

FIG. 7 is a cross-sectional view of the semiconductor device 100 depicting the post deposition treatment process according to one or more embodiments. FIG. 7 is an example illustrating that some of the metallic residue 42 may be partially converted to the insulating material 54 while some of the metallic residue 42 is completely converted (or nearly completely converted, e.g., more than 50%, 60%, 70%, 80%, 90%) to the insulating material 54.

Further, FIG. 7 illustrates that after the post deposition treatment process, an additional dielectric layer 72 in the BEOL stack may be deposited on top of the semiconductor device 100. The dielectric layer 72 covers the bottom layer 12, the insulating material 52 of the metal cap 41, and the insulating material 54 of metallic residue 42. Holes may be formed through the dielectric layer 72, through the insulating material 52 down to the conductive material of the metal cap 41; the holes are filled with a conductive material to form conductive vias 74. Accordingly, the thin layer of insulating material 52 does not negatively affect the electrical conduction of the metal caps 41 and metal interconnects 32, as the metal vias 74 provide direction connection to the metal caps 41 and metal interconnects 32. The dielectric layer 72 may be comprised of $SiO_2$ or an ultra-low k dielectric material.

Figure 8:
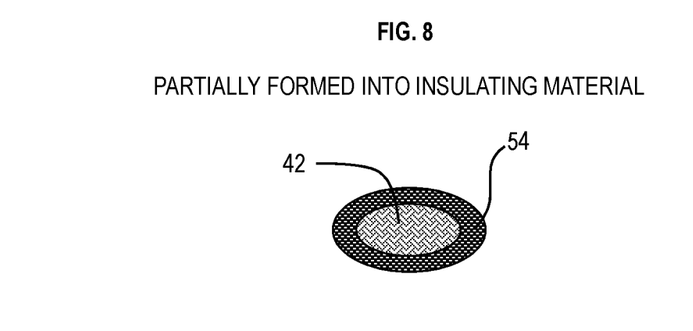
FIG. 8 is an enlarged view of metallic residue partially converted into insulating material after the post deposition treatment process according to one or more embodiments.

FIG. 8 is an enlarged view illustrating the metallic residue 42 after the post deposition treatment according to one or more embodiments. In FIG. 8, the metallic residue 42 is partially formed into the insulating material 54 via the reactant 58.

Figure 9:
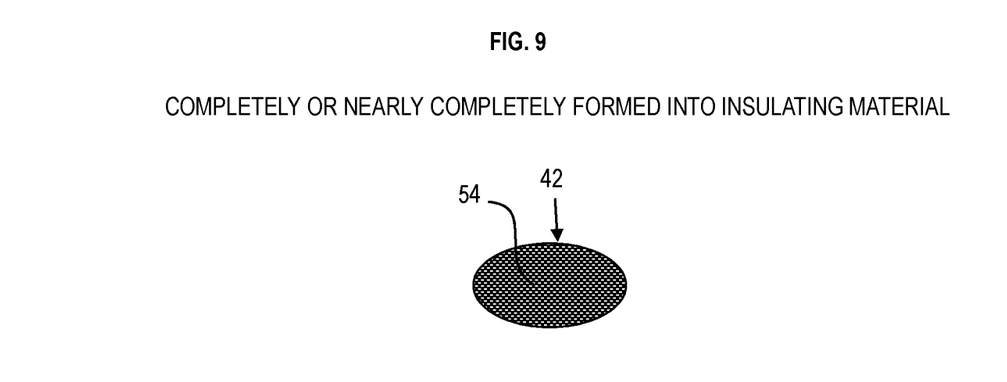
FIG. 9 is an enlarged view of metallic residue completely converted insulating material of the metallic residue after the post deposition treatment according to one or more embodiments.

FIG. 9 is an enlarged view illustrating the metallic residue 42 after the post deposition treatment according to one or more embodiments. In FIG. 9, the metallic residue 42 is completely (and/or nearly completely) formed into the insulating material 54 via the reactant 58.

Figure 10:
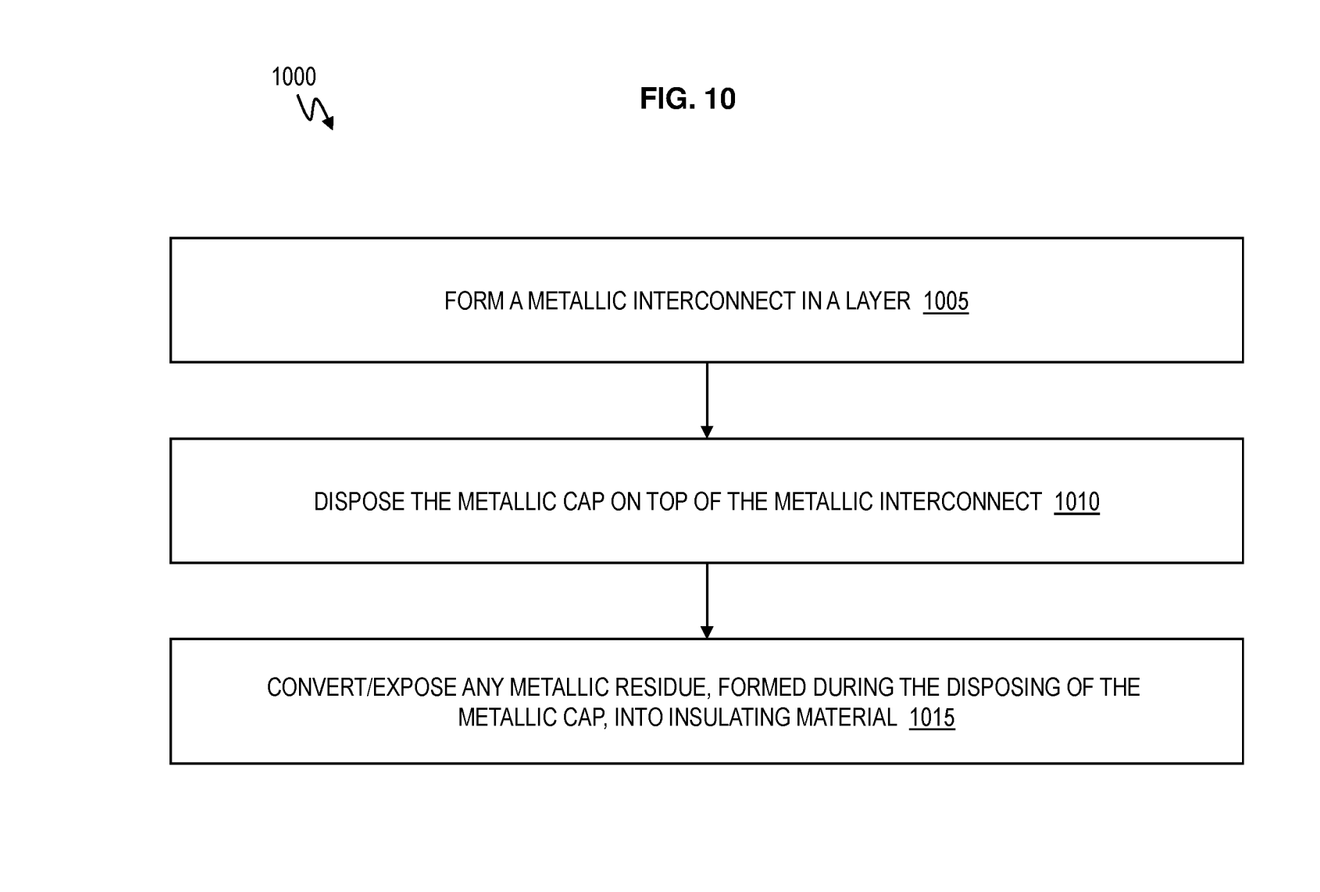
FIG. 10 is a flow chart of a method of treating metallic interconnects according to one or more embodiments.

FIG. 10 is a flow chart of a method 1000 of treating metallic interconnects 32 according to one or more embodiments. Reference can be made to FIGS. 1-9.

At block 1005, a metallic interconnect 32 is formed in a layer 12.

At block 1010, the metal cap 41 is disposed on top of the metallic interconnect 32.

At block 1015, any metallic residue 42, formed during the disposition of the metallic cap, is converted into the insulating material 54.

Converting any metallic residue 42 into the insulating material 54 includes converting a surface (e.g., outer surface) of the metallic residue 42 into the insulating material 54. Converting any metallic residue 42 into the insulating material 54 includes converting an entirety of the metallic residue 42 into the insulating material 54. The insulating material 54 is treated metallic residue 42 such that the insulating material 54 is now inert (i.e., nonconductive).

Converting any metallic residue 42 into the insulating material 54 includes converting at least one of a surface of first ones of the metallic residue 42 into the insulating material 54 and an entirety of second ones of the metallic residue 42 into the insulating material 54.

An outer lining of the metallic cap 41 is converted into the insulating material 52. A conductive via 74 is formed through the outer lining of the metallic cap 41 to reach the conductive material of the metallic cap.

The insulating material 52, 54 includes a selection from at least one of an oxide and/or nitride. The insulating material 52, 54 is a silicide or silicate that is not conductive.

In the semiconductor device 100, the metallic interconnects 32 are each formed to be separate from one another. Converting the metallic residue 42, formed during the disposing of the metallic cap 41, into insulating material 54 prevents any metallic residue 42 from being conductive, thereby avoiding an electrical leakage path between the metallic interconnects 32.

The metallic residue 42, from disposing the metallic cap 41, is formed at one or more locations on the bottom layer 12, and insulating material 54 is formed from the metallic residue 42 at the locations. Although only a few example locations are illustrated in the figures, it is contemplated that there can be many more locations or fewer locations than depicted.

Technical effects and benefits include improved semiconductor devices, including, for example, improved integrated circuits. A post deposition treatment is utilized to convert metallic particles/residue into insulating material, and/or to maintain reliability of the metal (e.g., Cu) interconnects without leakage-related yield degradation from a metal cap. The yield of the metal interconnect trenches with metallic capping that undergo the post deposition treatment is also improved over comparable metal capped interconnect trenches without the post deposition treatment, thereby evidencing that failures due to shorting or TDDB effects are mitigated.

It should be appreciated that the design for semiconductor devices may be included in or utilize features of an integrated circuit layout. An integrated circuit (IC) layout is also known as an IC layout, IC mask layout, or mask design. The integrated circuit layout is the representation of an integrated circuit in terms of planar geometric shapes which correspond to the patterns of metal, oxide, semiconductor layers, etc., that make up the components of the integrated circuit. Such an integrated circuit layout, including the layout of a semiconductor device, may be stored in a computer readable medium in preparation for fabrication as understood by one skilled in the art.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of treating metallic interconnects, the method comprising:
    forming a metallic interconnect in a layer;
    disposing a metallic cap on top of the metallic interconnect; and
    converting a metallic residue into an insulating material, wherein the metallic residue was formed during the disposing of the metallic cap, wherein the insulating material is a silicide or silicate that is not conductive.

2. The method of claim 1, wherein converting the metallic residue into the insulating material includes converting a surface of the metallic residue into the insulating material.

3. The method of claim 1, wherein converting the metallic residue into the insulating material includes converting an entirety of the metallic residue into the insulating material.

4. The method of claim 1, wherein converting the metallic residue into the insulating material includes converting at least one of a surface of first ones of the metallic residue into the insulating material and an entirety of second ones of the metallic residue into the insulating material.

5. The method of claim 1, wherein an outer lining of the metallic cap is converted into the insulating material.

6. The method of claim 5, wherein a conductive via is formed through the outer lining of the metallic cap to reach conductive material of the metallic cap.

7. The method of claim 1, wherein the insulating material includes a selection from at least one of an oxide and nitride.

8. A method of forming metallic interconnects, the method comprising:
    forming the metallic interconnects in a layer, each of the metallic interconnects being separate from one another;
    disposing a metallic cap on top of each of the metallic interconnects; and
    converting any metallic residue, formed during the disposing of the metallic cap, into insulating material, wherein the insulating material prevents the any metallic residue from being conductive, thereby avoiding electrical connection between the metallic interconnects, wherein the insulating material is a silicide or silicate that is not conductive.

9. The method of claim 8, wherein converting the any metallic residue into the insulating material includes converting a surface of the metallic residue into the insulating material.

10. The method of claim 8, wherein converting the any metallic residue into the insulating material includes converting an entirety of the metallic residue into the insulating material.

11. The method of claim 8, wherein converting the any metallic residue into the insulating material includes converting at least one of a surface of first ones of the metallic residue into the insulating material and an entirety of second ones of the metallic residue into the insulating material.

\* \* \* \* \*